United States Patent
Ross et al.

(10) Patent No.: US 10,492,327 B2
(45) Date of Patent: Nov. 26, 2019

(54) SHELF-MOUNTED MODULAR COMPUTING UNIT

(71) Applicant: Amazon Technologies, Inc., Reno, NV (US)

(72) Inventors: Peter George Ross, Olympia, WA (US); Darin Lee Frink, Lake Tapps, WA (US)

(73) Assignee: Amazon Technologies, Inc., Reno, NV (US)

(*) Notice: Subject to any disclaimer, the term of this patent is extended or adjusted under 35 U.S.C. 154(b) by 0 days.

(21) Appl. No.: 15/714,842

(22) Filed: Sep. 25, 2017

(65) Prior Publication Data
US 2018/0014425 A1    Jan. 11, 2018

Related U.S. Application Data

(63) Continuation of application No. 15/194,499, filed on Jun. 27, 2016, now Pat. No. 9,775,263, which is a continuation of application No. 14/733,898, filed on Jun. 8, 2015, now Pat. No. 9,380,729, which is a continuation of application No. 13/069,099, filed on Mar. 22, 2011, now Pat. No. 9,055,690.

(51) Int. Cl.
| | |
|---|---|
| *G06F 1/16* | (2006.01) |
| *H05K 5/00* | (2006.01) |
| *H05K 7/00* | (2006.01) |
| *H05K 7/14* | (2006.01) |
| *G06F 1/18* | (2006.01) |

(52) U.S. Cl.
CPC ......... *H05K 7/1489* (2013.01); *G06F 1/187* (2013.01); *H05K 7/1487* (2013.01); *H05K 7/1488* (2013.01)

(58) Field of Classification Search
CPC ........... G06F 1/18–187; H05K 7/1489; H05K 7/1487; H05K 7/1488
USPC ........... 361/679.6, 679.01, 679.02, 724–727; 312/223.1, 223.2, 223.3
See application file for complete search history.

(56) References Cited

U.S. PATENT DOCUMENTS

| | | | | |
|---|---|---|---|---|
| 7,200,008 | B1* | 4/2007 | Bhugra | G11B 25/043 361/679.21 |
| 7,583,507 | B2 | 9/2009 | Starr et al. | |
| 8,120,922 | B2 | 2/2012 | Randall et al. | |
| 8,599,550 | B2* | 12/2013 | Davis | G11B 33/128 361/679.33 |
| 9,055,690 | B2 | 6/2015 | Ross et al. | |
| 9,380,729 | B2 | 6/2016 | Ross et al. | |
| 9,775,263 | B2 | 9/2017 | Ross et al. | |

(Continued)

OTHER PUBLICATIONS

US 8,941,998 B1, 01/2015, Ross (withdrawn)

(Continued)

*Primary Examiner* — Anthony M Haughton
(74) *Attorney, Agent, or Firm* — Robert C. Kowert; Meyertons, Hood, Kivlin, Kowert & Goetzel P.C.

(57) ABSTRACT

A system for performing computing operations includes a rack, one or more shelves coupled to the rack, and two or more computing modules. Each computing module may include a chassis, one or more circuit board assemblies in a primarily vertical orientation, and one or more hard disk drives in a primarily vertical orientation. The circuit board assemblies and the hard disk drives are coupled to the chassis of the computing module.

20 Claims, 8 Drawing Sheets

(56) References Cited

U.S. PATENT DOCUMENTS

| | | | |
|---|---|---|---|
| 2005/0152106 A1 | 7/2005 | Coster et al. | |
| 2005/0257232 A1* | 11/2005 | Hidaka | G11B 33/126 |
| | | | 720/654 |
| 2006/0048001 A1* | 3/2006 | Honda | G11B 33/142 |
| | | | 714/6.32 |
| 2007/0233781 A1* | 10/2007 | Starr | G11B 33/126 |
| | | | 709/203 |
| 2008/0191590 A1* | 8/2008 | Lin | G11B 33/128 |
| | | | 312/223.2 |
| 2009/0086441 A1 | 4/2009 | Randall et al. | |
| 2010/0118484 A1* | 5/2010 | Sasagawa | G06F 1/20 |
| | | | 361/679.37 |
| 2010/0172083 A1* | 7/2010 | Randall | G11B 33/126 |
| | | | 361/679.31 |
| 2011/0007464 A1* | 1/2011 | Leigh | H01R 9/2408 |
| | | | 361/679.01 |
| 2011/0249392 A1* | 10/2011 | Kadri | G06F 1/187 |
| | | | 361/679.37 |

OTHER PUBLICATIONS

"DCS 8025: Service Engineer's Manual," Version 1.0 © 2010, Dell Inc., pp. 1-126.
Extended European Search Report in Application No. 12760868.5, dated Jul. 22, 2015, Amazon Technologies, Inc., pp. 1-7.

* cited by examiner

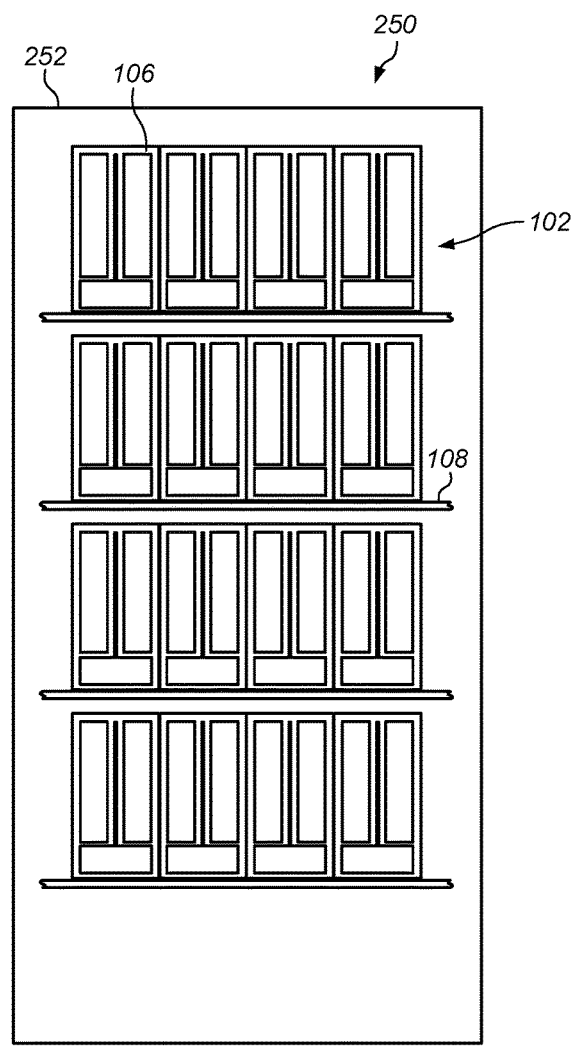
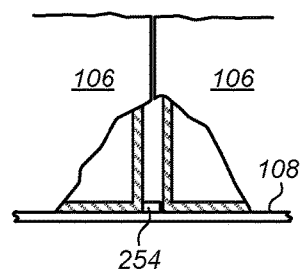
FIG. 7
FIG. 8

SHELF-MOUNTED MODULAR COMPUTING UNIT

This application is a continuation of U.S. patent application Ser. No. 15/194,499, filed Jun. 27, 2016, now U.S. Pat. No. 9,775,263, which is a continuation of U.S. patent application Ser. No. 14/733,898, filed Jun. 8, 2015, now U.S. Pat. No. 9,380,729, which is a continuation of U.S. patent application Ser. No. 13/069,099, filed Mar. 22, 2011, now U.S. Pat. No. 9,055,690, which are hereby incorporated by reference in their entirety.

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carried out an organization's operations. Typically, a computer room of a computing facility includes many server racks. Each server rack, in turn, includes many servers and associated computer equipment.

Computer systems typically include a number of components that generate waste heat. Such components include printed circuit boards, mass storage devices, power supplies, and processors. For example, some computers with multiple processors may generate 250 watts of waste heat. Some known computer systems include a plurality of such larger, multiple-processor computers that are configured into rack-mounted components, and then are subsequently positioned within a rack system. Some known rack systems include 40 such rack-mounted components and such rack systems will therefore generate as much as 10 kilowatts of waste heat. Moreover, some known data centers include a plurality of such rack systems.

Some servers include a number of hard disk drives (for example, eight or more hard disk drives) to provide adequate data storage. Typically, the hard disk drives for servers are of a standard, off-the-shelf type. Standard, off-the-shelf hard disk drives are often a cost effective solution for storage needs because such hard disk drives can be obtained at relatively low cost. Nonetheless, in server designs using such standard hard disk drives, the arrangement of the hard disk drives may leave a substantial amount of wasted space in the server chassis. This wasted space, especially when multiplied over many servers in a rack, may result in inadequate computing or storage capacity for a system.

Hard disk drives include motors and electronic components that generate heat. Some or all of this heat must be removed from the hard disk drives to maintain continuous operation of a server. The amount of heat generated by the hard disk drives within a data room may be substantial, especially if all of the hard disk drives are fully powered up at all times.

As with other components, hard disk drives fail from time to time while in service. These failures reduce the storage capacity of a system. To restore capacity, servers may need to be powered down and removed from a rack so that the defective hard disk drives can be replaced or repaired.

In some systems, such as archival, backup, or disaster recovery systems, a vast amount of may need to be stored, though any particular piece of the stored data may be accessed only rarely. Magnetic tape systems are often used to store archival data. Magnetic tape drives, however, may be fragile and susceptible to adverse environmental conditions, such as heat and humidity. In addition, some magnetic tape drives have relatively high failure rates.

BRIEF DESCRIPTION OF THE DRAWINGS

FIG. 7 illustrates one embodiment of a rack system including computing modules on shelves.

FIG. 8 is a detail view illustrating one embodiment of spacing tabs between adjacent computing modules.

Figure 1:
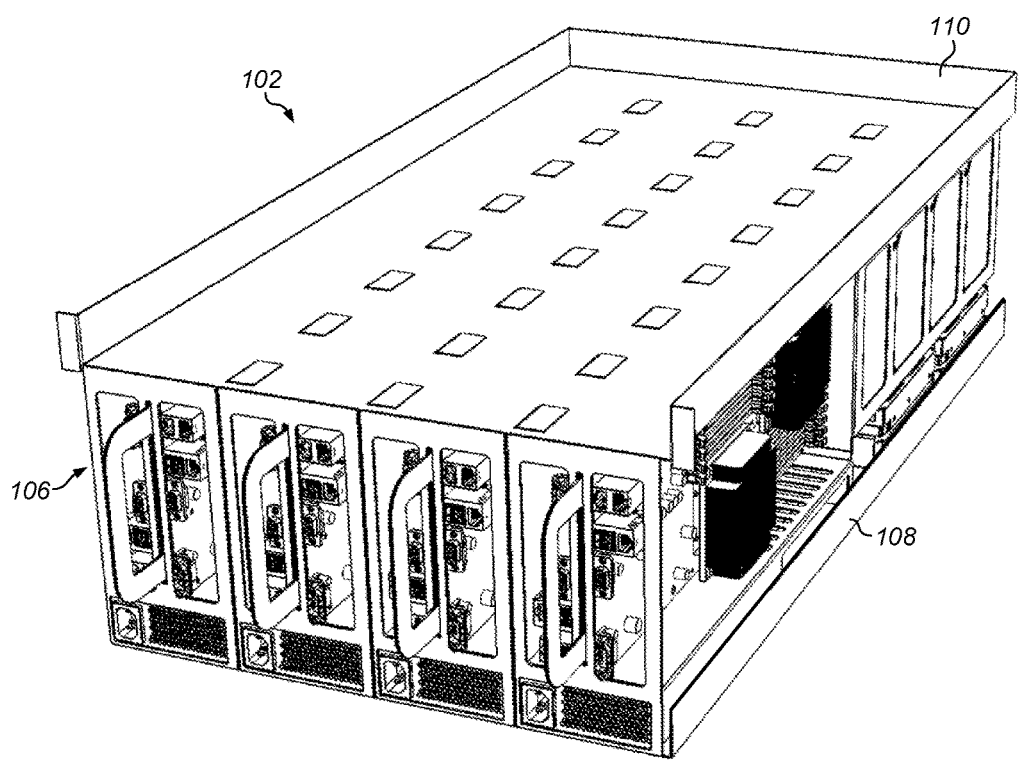
FIG. 1 illustrates one embodiment of a shelf module that includes four computing modules having vertically oriented hard disk drives and circuit board assemblies.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of computer systems, and systems and methods for performing computing operations, are disclosed. According to one embodiment, a system for performing computing operations includes a rack, one or more shelves coupled to the rack, and two or more computing modules. Each computing module may include a chassis, one or more circuit board assemblies in a primarily vertical orientation, and one or more hard disk drives in a primarily vertical orientation. The circuit board assemblies and the hard disk drives are coupled to the chassis of the computing module. The chassis of the computing module couples with one of the shelves.

According to one embodiment, a computing module includes a chassis, one or more circuit board assemblies, and one or more hard disk drives. The circuit board assemblies and the hard disk drives are coupled to the chassis in a primarily vertical orientation. The chassis can be installed on a shelf in a rack.

According to one embodiment, a method of providing computing capacity includes providing two or more computing modules on a shelf. The computing modules include one or more circuit board assemblies in a primarily vertical orientation and one or more hard disk drives in a primarily vertical orientation. Computing operations are performed with the computing module.

As used herein, "air handling system" means a system that provides or moves air to, or removes air from, one or more systems or components.

As used herein, "air moving device" includes any device, element, system, or combination thereof that can move air. Examples of air moving devices include fans, blowers, and compressed air systems.

As used herein, an "aisle" means a space next to one or more elements, devices, or racks.

As used herein, "ambient" means, with respect to a system or facility, the air surrounding at least a portion of the system or facility. For example, with respect to a data center, ambient air may be air outside the data center, for example, at or near an intake hood of an air handling system for the data center.

As used herein, a "cable" includes any cable, conduit, or line that carries one or more conductors and that is flexible over at least a portion of its length. A cable may include a connector portion, such as a plug, at one or more of its ends.

As used herein, "chassis" means a structure or element that supports another element or to which other elements can be mounted. A chassis may have any shape or construction, including a frame, a sheet, a plate, a box, a channel, or a combination thereof. In one embodiment, a chassis is made from one or more sheet metal parts. A chassis for a computer system may support circuit board assemblies, power supply units, data storage devices, fans, cables, and other components of the computer system.

As used herein, "computing" includes any operations that can be performed by a computer, such as computation, data storage, data retrieval, or communications.

As used herein, "computer system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers dedicated to specific functions or serving multiple functions. Examples of computer operations include information processing, communications, testing, simulations, power distribution and control, and operational control.

As used herein, "data center module" means a module that includes, or is suitable for housing and/or physically supporting, one or more computer systems that can provide computing resources for a data center.

As used herein, to "direct" air includes directing or channeling air, such as to a region or point in space. In various embodiments, air movement for directing air may be induced by creating a high pressure region, a low pressure region, or a combination both. For example, air may be directed downwardly within a chassis by creating a low pressure region at the bottom of the chassis. In some embodiments, air is directed using vanes, panels, plates, baffles, pipes or other structural elements.

As used herein, "member" includes a single element or a combination of two or more elements (for example, a member can include two or more sheet metal parts fastened to one another.

As used herein, a "module" is a component or a combination of components physically coupled to one another. A module may include functional elements and systems, such as computer systems, circuit boards, racks, blowers, ducts, and power distribution units, as well as structural elements, such a base, frame, housing, or container.

As used herein, "primarily horizontal" means more horizontal than vertical. In the context of an installed element or device, "primarily horizontal" includes an element or device whose installed width is greater than its installed height.

As used herein, "primarily vertical" means more vertical than horizontal. In the context of an installed element or device, "primarily vertical" includes an element or device whose installed height is greater than its installed width. In the context of a hard disk drive, "primarily vertical" includes a hard disk drive that is installed such that the installed height of the hard disk drive is greater than the installed width of the hard disk drive.

As used herein, a "rack" means a rack, container, frame, or other element or combination of elements that can contain or physically support one or more computer systems.

As used herein, "room" means a room or a space of a building. As used herein, "computer room" means a room of a building in which computer systems, such as rack-mounted servers, are operated.

As used herein, a "space" means a space, area or volume.

As used herein, "shelf" means any element or combination of elements on which an object can be rested. A shelf may include, for example, a plate, a sheet, a tray, a disc, a block, a grid, or a box. A shelf may be rectangular, square, round, or another shape. In some embodiments, a shelf may be one or more rails.

In some embodiments, a computing system includes shelf-mounted computing modules having vertically oriented hard disk drives and vertically oriented circuit board assemblies. In some embodiments, a data center includes many racks in a computer room, each including a number of shelf modules.

FIG. 1 illustrates one embodiment of a shelf module for a computing system. Shelf module 102 includes computing modules 106, bottom shelf member 108, and top shelf member 110. Computing modules 106 rest on bottom shelf member 108. In the embodiment shown in FIG. 1, shelf module 102 includes 4 computing modules. A shelf module may, however, include any number of computing modules. In one embodiment, the shelf module is about 5 U in height. In some embodiments, shelves are spaced for providing two or more rows of computing modules. For example, a second row of computing modules may be placed on top shelf member 110. In some embodiments, shelf module 102 includes side panels (not shown in FIG. 1 for clarity).

Shelf modules 102 may be rack-mountable in a rack. For example, rails may be installed on the left and right sides of shelf module 102 to engage on corresponding rails, slides, or ledges, on left and right sides of a rack. In certain embodiments, a rail kit may be installed on the sides of the shelf for the computing modules.

Figure 2:
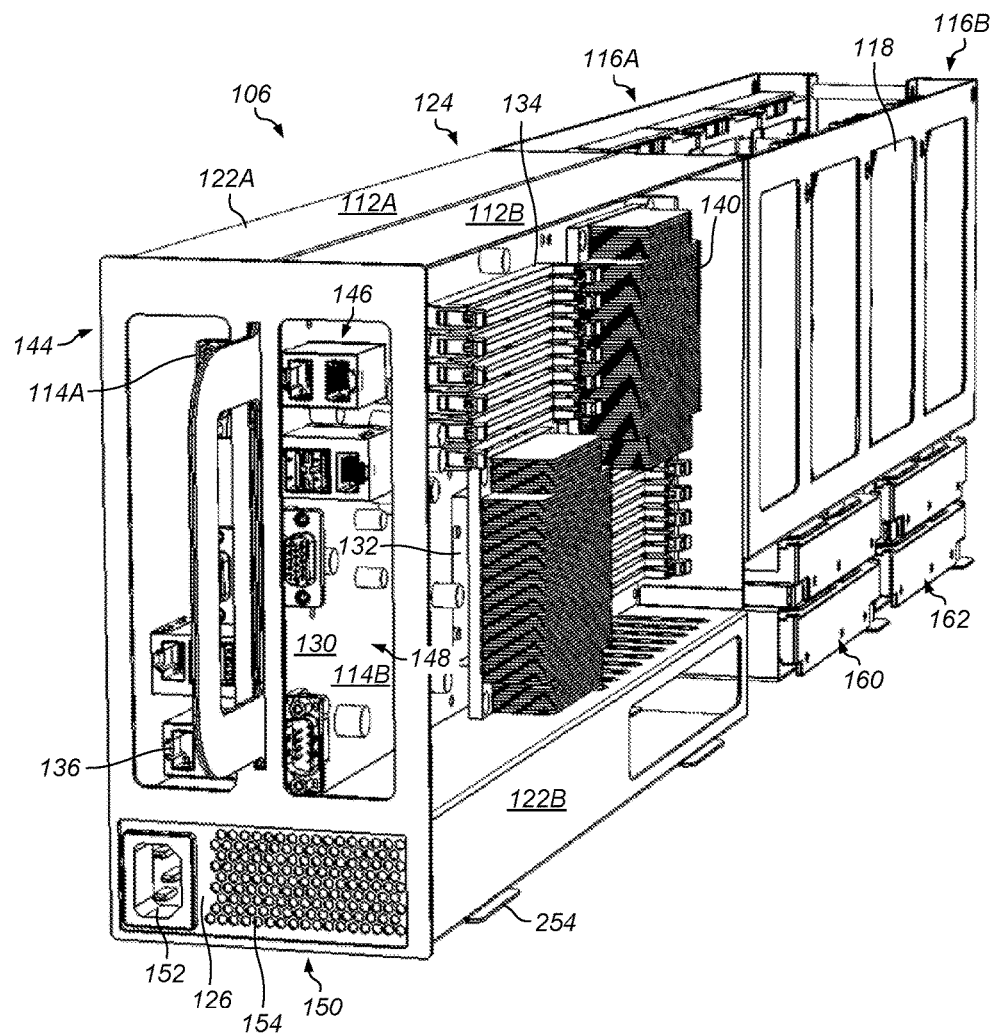
FIG. 2 illustrates a computing module including two computing units, each having a row of storage devices in a vertical orientation.

In some embodiments, a computing module includes one or more mass storage devices in a vertical orientation. FIG. 2 illustrates a computing module including two computing units, each having a row of mass storage devices in a vertical orientation. Computing module 106 includes left computing unit 112A and right computing unit 112B. Each of left computing unit 112A and right computing unit 112B may serve as a compute node for the system.

Left computing unit 112A includes left motherboard assembly 114A and left hard disk drive array 116A. Right computing unit 112B includes right motherboard assembly 114B and right disk drive array 116B. Each of left disk drive array 116A and right disk drive array 116B includes hard disk drives 118.

Left motherboard assembly 114A may be coupled to hard disk drives 118 in left disk drive array 116A. Left motherboard assembly 114A may control, and access data on, hard disk drives 118 in left disk drive array 116A. Right motherboard assembly 114B may be coupled to hard disk drives 118 in right disk drive array 116B. Right motherboard assembly 114B may control, and access data on, hard disk drives 118 in left disk drive array 116B. Left motherboard assembly 114A and right motherboard assembly 114B may operate independently of one another.

Left computing unit 112A includes left chassis member 122A. Right computing unit 112B includes right chassis member 122B. Left chassis member 122A carries left motherboard assembly 114A and hard disk drives 118 of left disk drive array 116A. Right chassis member 122B carries right motherboard assembly 114B and hard disk drives 118 of right disk drive array 116B. Left chassis member 122A and right chassis member 122B may combine to form chassis 124 for the computing module.

Computing module 106 includes power supply unit 126. In the embodiment shown in FIGS. 1 and 2, power supply unit 126 may supply electrical power for the motherboard assembly, hard disk drives, and other components of both left computing unit 112A and right computing unit 112B. Nevertheless, in certain embodiments, a separate power supply may be provided for each of the left computing unit and the right computing unit.

In various embodiments, a computing unit includes a power supply that conforms to an industry-recognized standard. In some embodiments, a power supply for a computing unit has a form factor in accordance with an industry-recognized standard. In one embodiment, power supply unit 126 has a standard 1 U form factor. Examples of other standards for a power supply and/or a power supply form factor include 2 U, 3 U, SFX, ATX, NLX, LPX, or WTX.

Right motherboard assembly 114B includes circuit board 130, processors 132, DIMM slots 134, and I/O connectors 136. Right motherboard assembly 114B may include various other semiconductor devices, resistors, and other heat producing components. Right motherboard assembly 114B, along with other components in chassis 124 (hard disk drives, power supplies) and/or components external to chassis 124, may operate in conjunction with one another as a computer system. For example, computing unit 112B may be a file server.

Heat sinks 140 are mounted on processors 132. Heat sinks 140 may transfer heat from processors 132 to air inside chassis 124 during operation of computer module 106. DIMMs (not shown for clarity) may be installed in any or all of DIMM slots 134.

In the embodiment shown in FIG. 2, computing unit 106 includes one power supply unit and 12 hard disk drives. A computer system may, however, have any number of hard disk drives, power supply units, or other components. In certain embodiments, a computer system may have one or more internal fans to promote the flow of air through a computer system. For example, in certain embodiments, a row of fans may be provided along the rear edge of computing unit 106. In certain embodiments, a computing unit may have no fans and/or no disk drives. In certain embodiments, a power supply may be external to a computing unit. For example, in certain embodiments, left motherboard assembly 114A and right motherboard assembly 114B may receive power from a power supply external to computing module 106 (such as a rack-level power supply), and power supply unit 126 may be omitted.

At front 144 of computing module 106, computing module 106 includes input/output panel 146 and air vents 148. Power supply unit 126 includes power supply panel 150. Power supply panel 150 includes input power receptacle 152 and air vents 154.

In some embodiments, a computing module includes mass storage devices that are mounted in two or more different orientations. In one embodiment, a computing unit includes one or more hard disk drives mounted in a horizontal orientation and one or more hard disk drives mounted in a vertical orientation. For example, in the embodiment shown in FIG. 1, computing module 106 includes front hard disk array 160 and rear hard disk array 162 in a vertical orientation and hard disk drives 202 in a horizontal orientation.

Figure 3:
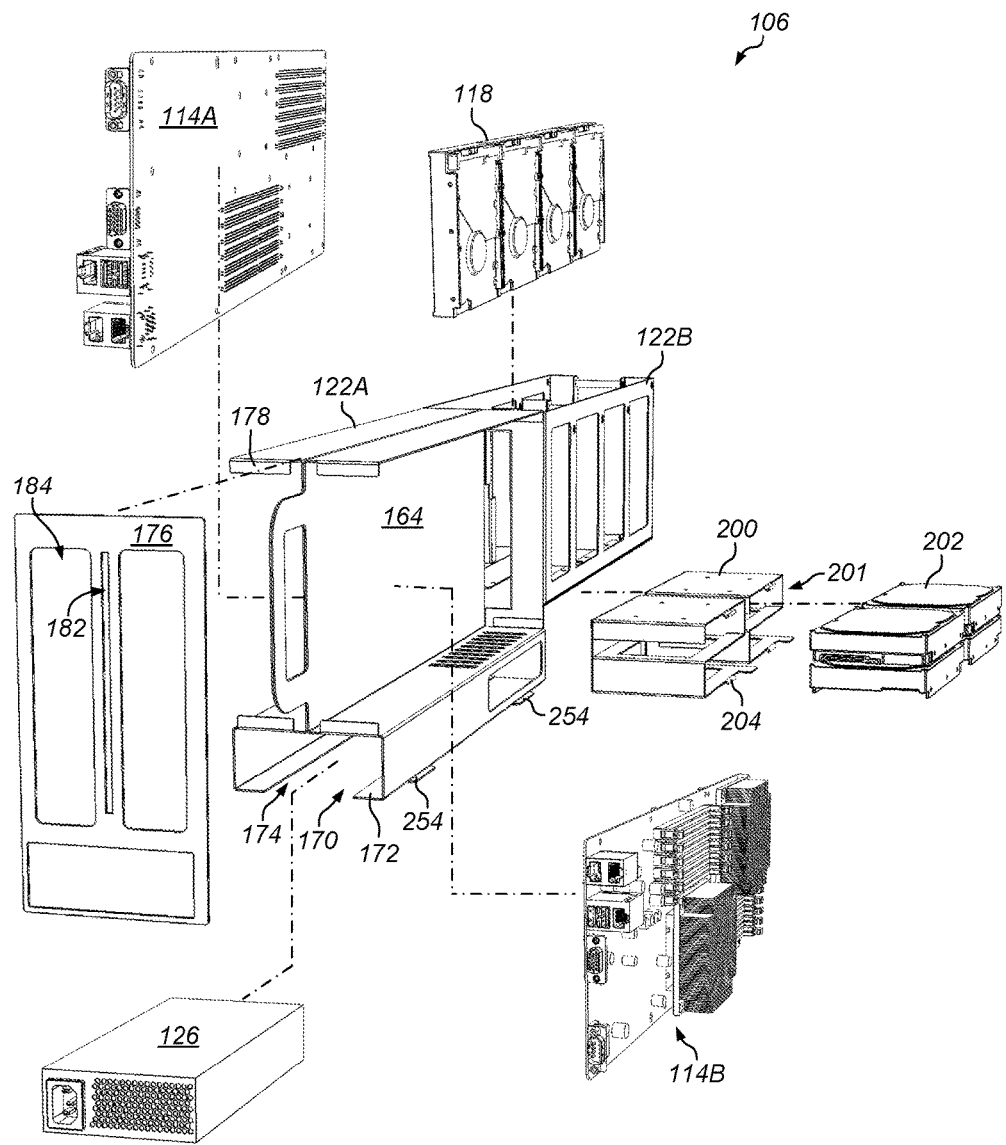
FIG. 3 is a partially exploded view illustrating one embodiment of a computing module.

FIG. 3 is a partially exploded view illustrating one embodiment of a computing module. Left chassis member 122A and right chassis member 122B each include motherboard seat 164. Left motherboard assembly 114A and right motherboard assembly 114B are each coupled to a chassis member in a respective motherboard seat 164. Left motherboard assembly 114A and right motherboard assembly 114B may be attached by any suitable manner. In one embodiment, the motherboard assemblies are attached to the respective chassis members using screws.

The bottom portions of left chassis member 122A and right chassis member 122B include channels 170. Each of channels 170 includes interior lip 172. Channels 170 of left chassis member 122A and right chassis member 122B combine to form power supply slot 174. Power supply unit 126 may be installed in power supply slot 174. Power supply unit 126 may be supported on interior lips 172 of channels 170.

Faceplate 176 may be coupled to left chassis member 122A and right chassis member 122B. In some embodiments, faceplate 176 is fastened to left chassis member 122A and right chassis member 122B by way of screws engaging in tabs 178 on left chassis member 122A and right chassis member 122B. Handle portions 180 of left chassis member 122A and right chassis member 122B may contact one another and pass through handle slot 182 when faceplate 176 is installed on left chassis member 122A and right chassis member 122B. Faceplate 176 includes openings 184 for motherboard cabling connections and airflow and power supply cabling connections and airflow.

Left chassis member 122A and right chassis member 122B each include top disk drive slots 190. Hard disk drives 118 may be installed and removed from top disk drive slots 190 from the top of computing module 106. In FIG. 3, only the hard disk drives 118 for the left disk drive array are shown for the sake of clarity).

Lower disk drive carrier 200 may be attached to left chassis member 122A and right chassis member 122B. Lower drive carrier 200 includes side disk drive slots 201. Hard disk drives 202 may be installed and removed out the side of chassis 124 of computing module 106. In some embodiments, hard disk drives 202 and hard disk drives 118 are of the same type, capacity, and form factor. In other embodiments, hard disk drives 202 and hard disk drives 118 are of a different type, capacity or form factor (for example, hard disk drives 202 may be shorter than hard disk drives 118). Lower disk drive carrier 200 includes retention tabs 204. Retention tabs 204 may resiliently engage hard disk drives 202 when installed to maintain the hard disk drives in place on computing module 106.

Although in the embodiments described in FIGS. 1-4, hard disk drives are horizontally mounted below vertically mounted hard disk drives, in other embodiments, the hard disk drives may be rearranged such that horizontally mounted hard disk drives are above the vertically mounted hard disk drives (either instead of, or in addition to, the lower horizontally mounted hard disk drives). Although in the embodiment described in FIGS. 1-4, there are two rows of vertically mounted hard disk drives and two rows of horizontally mounted hard disk drives, in other embodiments, any number hard disk drives may be mounted vertically and horizontally. In various embodiments, vertically and horizontally mounted hard disk drives share a common air passage.

Figure 4:
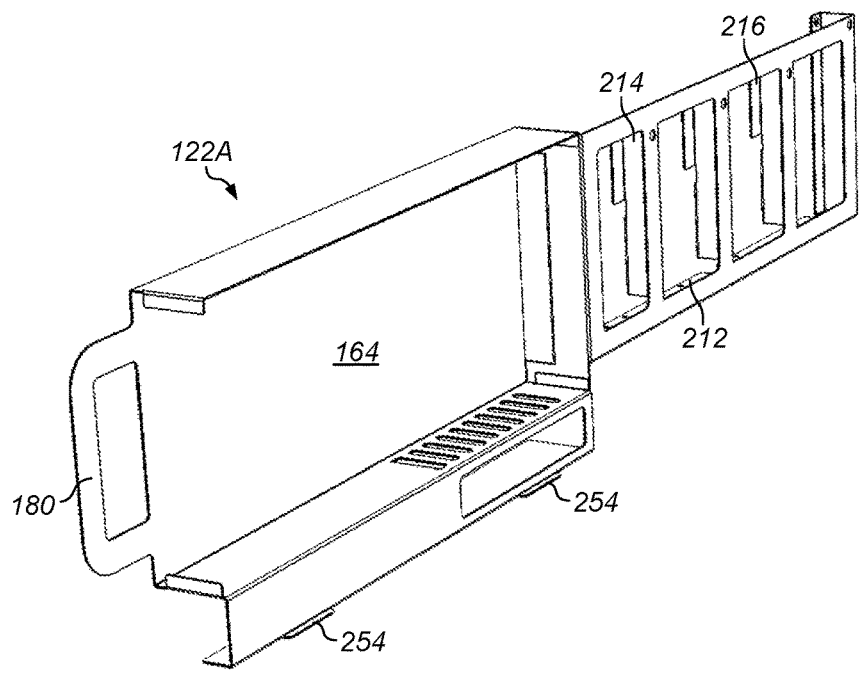
FIG. 4 illustrates one embodiment of a right chassis member for a computing module.
Figure 5:
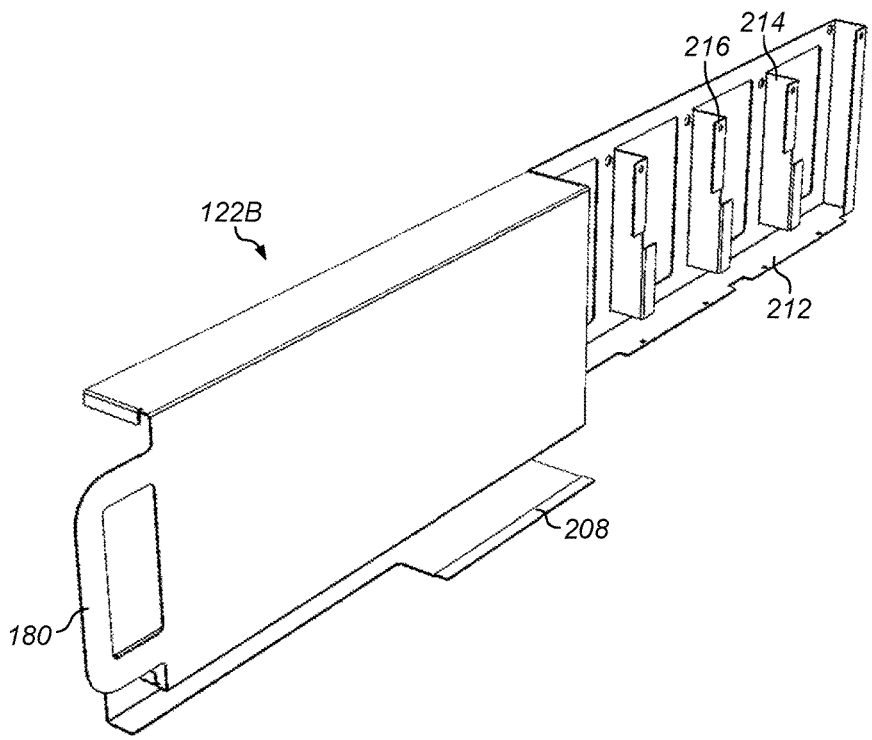
FIG. 5 illustrates one embodiment of left chassis member for a computing module.

FIG. 4 illustrates one embodiment of a right chassis member. FIG. 5 illustrates one embodiment of left chassis member. In certain embodiments, left chassis member 122A and right chassis member 122B may be mirror exact images of one another. In some embodiments, left chassis member 122A and right chassis member 122B have complementary features for connecting with one another. For example, as shown in FIG. 5, left chassis member 122A includes stepped lip 208. Stepped lip 208 may overlap a straight edge or a complementary stepped lip on right chassis member 122B when left chassis member 122A and right chassis member 122B are assembled to form chassis 124.

Chassis members may include seats for supporting hard disk drives. In some embodiments, hard disk drives are installed without any fasteners. In FIG. 5, for example, left chassis member 122A includes disk drive ledge 212, guides 214, and tabs 216. One of hard disk drives 118 may be installed between adjacent guides 214. Hard disk drives 118 may rest in disk drive seat 218 on disk drive ledge 212. Tabs 216 may maintain hard disk drives in position on disk drive ledge 212.

Figure 6:
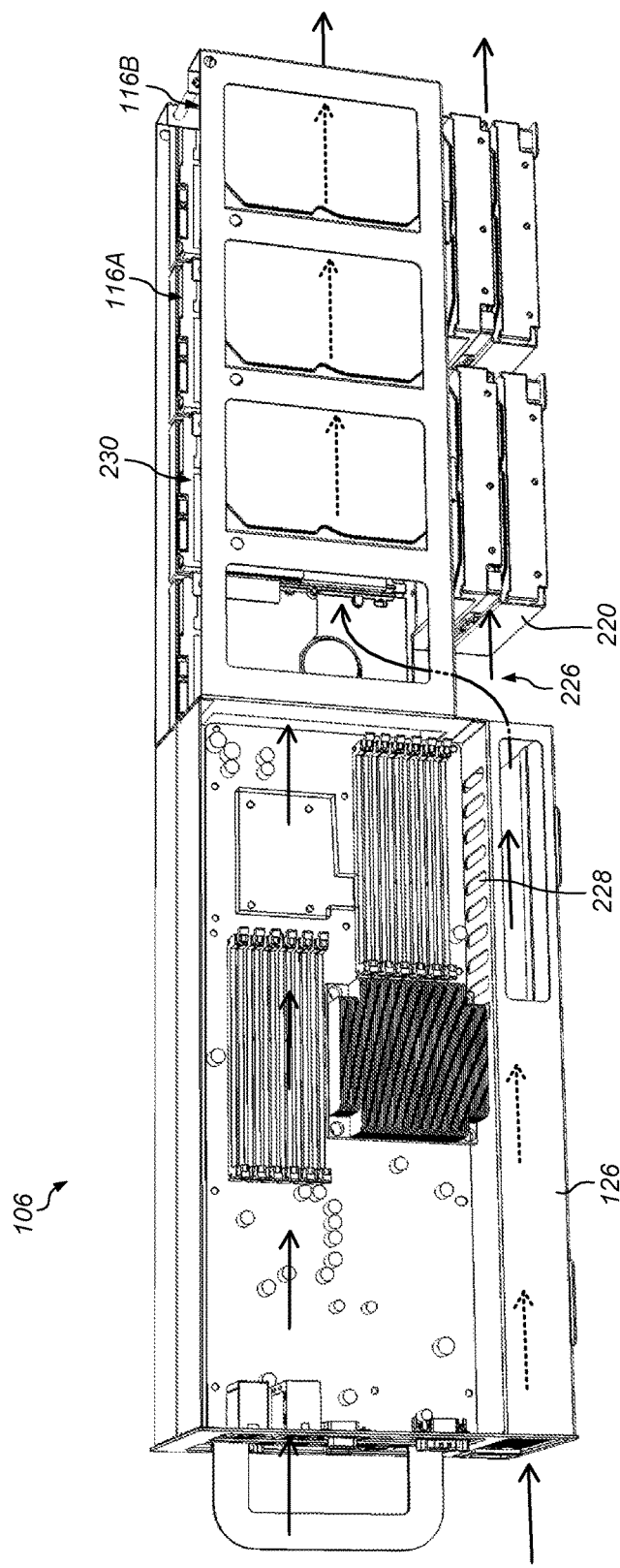
FIG. 6 illustrates airflow through a computing module in one embodiment.

In some embodiments, a system includes an air moving device that moves air through one or more computing modules. In one embodiment, air is moved from the front of a computing module to the rear of the computing module. FIG. 6 illustrates airflow through a computing module in one embodiment. In FIG. 6, air flow is shown on only the right side of the module for illustrative purposes. The air flow on the left side of the computing module may be similar to that shown on the right side.

Air may pass into computing module 106 through motherboard inlet 222 and across heat producing components on right motherboard assembly 114B. Air pass also pass through power supply inlet 224 and across heat-producing components in power supply unit 126. Air from power supply unit 126 may exit the power supply unit and pass into lower region 226 of computing module 106. In some embodiments, a portion of the air exiting the hard disk drive may pass through upwardly through vents 228.

Lower drive carrier 220 may block some or all of the air flow in the lower portion of the computing module, forcing the air upward into aisle 230 between left disk drive array 116A and right disk drive array 116B. Air from passing over right motherboard assembly 114B may pass through chassis slot 232 and into aisle 230. Thus, the air downstream from left motherboard assembly 114A, right motherboard assembly 114B, and power supply unit 126 may mix in aisle 230. Air in aisle 230 may continue to flow from front to back of computing module 106. Heat from the hard disk drives 118 in left disk drive array 116A and right disk drive array 116B, and from hard disk drives 202 in lower drive carrier 220, may be rejected into the air as it passes down aisle 230.

In some embodiments, a gap may be provided between the upper and lower disk drives in lower drive carrier 220 to allow airflow between the upper and lower drives in the lower carrier.

In some embodiments, hard disk drives 118 are standard, off-the-shelf disk drives. Examples of suitable hard disk drive form factors may include 3.5", 5.25", and 2.5". In one embodiment, a standard 3.5" hard disk drive is installed such that the installed height of the hard disk drive is the largest dimension.

FIG. 7 illustrates one embodiment of a rack system including computing modules on shelves. The rack system may be, for example, one of many rack systems in a computing room of a data center. System 250 includes rack 252 and shelf modules 102. Shelf modules 102 are mounted in rack 252. Computing modules 106 are mounted vertically on shelf members 108 of shelf modules 102. In one embodiment, 8 shelf modules each having a height of about 5 U include 4 computing modules each, for a total of 32 computing modules and 64 compute nodes. Nevertheless, a rack system may in various embodiments have any number of shelves and any number of computing modules.

In some embodiments, a chassis includes spacing elements or guides to align or position relative to one another or within a shelf or rack. FIG. 8 is a detail view illustrating one embodiment of spacing tabs between adjacent computing modules. Spacing tabs 254 (also shown in FIG. 2) on the right sides of chassis 124 may maintain computing modules 106 in a desired spacing relative to one another.

Figure 9:
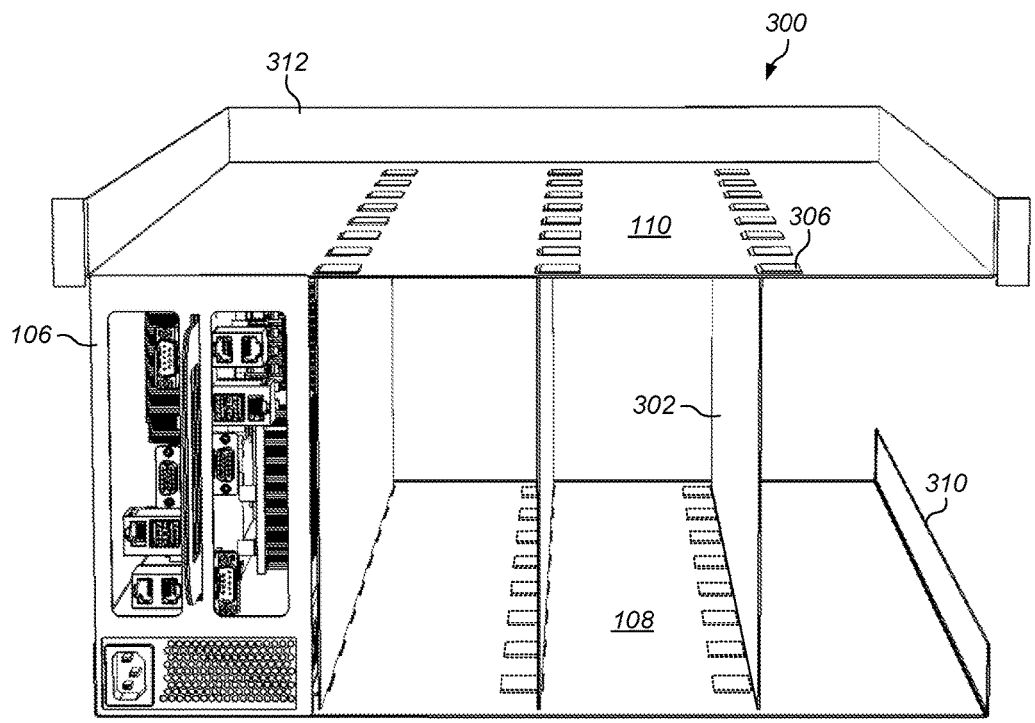
FIG. 9 illustrates one embodiment of a shelf assembly including vertical shelf members.

In some embodiments, a shelf module includes vertical members. The vertical members provide structural support, environmental protection, and EMI shielding for electronic devices in the computing modules. FIG. 9 illustrates one embodiment of a shelf assembly including vertical shelf members. Shelf assembly 300 includes bottom shelf member 108, top shelf member 110, and vertical members 302. Vertical shelf members 302 include bottom tabs 304 and top tabs 306. Bottom tabs 304 extending through bottom shelf member 108. Top tabs 306 extend through top shelf member 110. Bottom shelf member 108 includes lips 310. Top shelf member 110 includes rim 312 around the sides and rear of top shelf member 110.

In some embodiments, a shelf assembly for a computing modules couples with another shelf assembly immediately above or below it. The shelf assemblies may couple in such a way as to provide structural support and rigidity for holding computing modules in the shelves. The coupled shelf assemblies may, for example, mutually reinforce or cooperate with one another to provide a more rigid structure. In some embodiments, the junction between shelf assemblies creates a box section structure.

Figure 10:
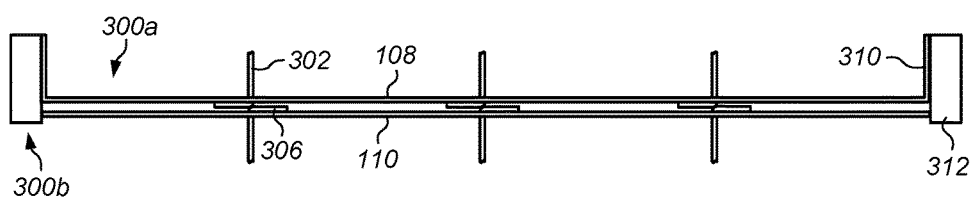
FIGS. 10 and 11 illustrate embodiments of one shelf assembly nesting on another shelf assembly.
Figure 11:
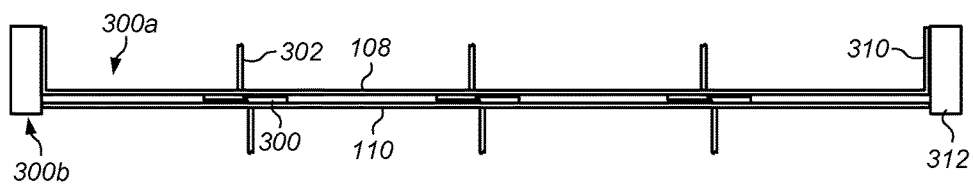

In some embodiments, a shelf assembly for computing modules may nest with the shelf below it. FIGS. 10 and 11 illustrate embodiments of one shelf assembly nesting on another shelf assembly. The structure of the shelf assemblies may be, for example, similar to that shown in FIG. 9. In FIG. 10, bottom tabs 304 of the upper shelf assembly 300*a* rest on top tabs 306 of the lower shelf assembly 300*b*. The combination of the tabs, side walls and shelf members may combine to form a box section structure at the junction between the two shelf assemblies.

In certain embodiments, a shelf assembly for computing modules may interlock with a shelf assembly above or below it. In FIG. 11, bottom tabs 304 of the upper shelf assembly 300*a* rest on top shelf member 110 of lower shelf assembly 300*b*. Bottom tabs 304 of the upper shelf assembly 300*a* rest on top tabs 306 of the lower shelf assembly 300*b* may include a complementary, ridge, flair, tang, or taper, such that upper shelf assembly 300*a* and lower shelf assembly 300*b* interlock at the junction between the two shelf assemblies. In certain embodiments, the junction between shelf assemblies may include one or more resilient elements (for example, spring tabs) to inhibit separation of the shelf assemblies from one another.

In some embodiments, rack-mounted computing modules are commonly cooled by a cooling air system that delivers air to the rack. To remove heat from computing modules installed in the rack, an air handling system may be operated to cause air to flow in computer room and through the rack system. As the air reaches the front of each of computing modules, the air may pass through the chassis of the computing modules. After passing through the chassis, the heated air may exit the rear of the rack system and flow out of the computer room. In certain embodiments, computing modules may have on board fans in addition to, or lieu of, a central cooling system. In certain embodiments, a rack may have a fan that supplies cooling air to all of the computing modules in the rack.

Figure 12:
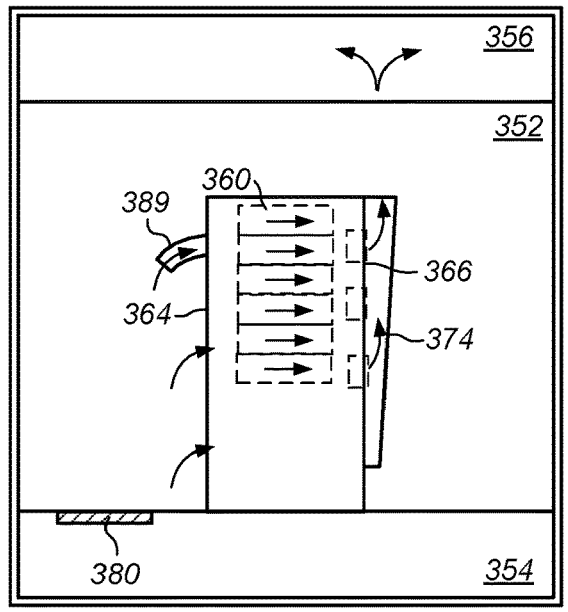
FIG. 12 illustrates one embodiment of removal of heat from data storage modules in a rack system.

FIG. 12 illustrates one embodiment of removal of heat from data storage modules in a rack system. Air may pass into computing room 352 from sub-floor plenum 354 by way of vent 380. Rear fans 366 in fan door 374 may draw air from front aisle 368 into rack 364, and through data storage modules 360 and data control modules 362. Rear fans 366 may exhaust heated air out of the rack. The heated air may pass into ceiling plenum 356. Air directing device 389 is provided on the front or rack. Air directing device 389 may be used to promote airflow in particular modules mounted in the rack. Other arrangements of air movers may be included in various embodiments. U.S. patent application Ser. No. 12/646,417, "Air Directing Device for Rack System", filed Dec. 23, 2009; U.S. patent Ser. No. 12/751,212, "Rack-Mounted Air Directing Device with Scoop", filed Mar. 30, 2010; and U.S. patent application Ser. No. 12/886,440, "System with Rack-Mounted AC Fans", filed Sep. 9, 2010, each of which is incorporated by reference as if fully set forth herein, include other arrangements, systems, devices, and techniques that may be used in various embodiments for cooling or mounting computing modules, data storage modules and data control modules.

Figure 13:
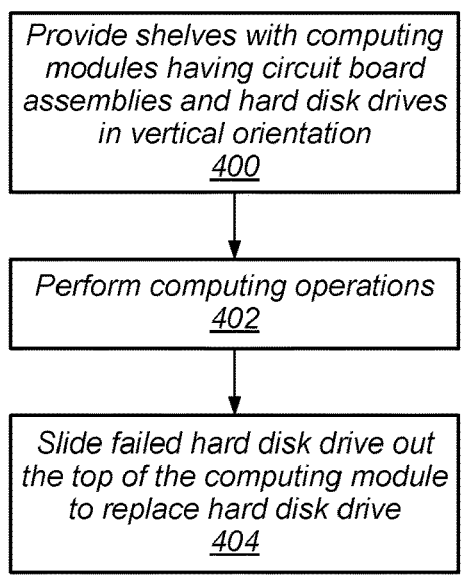
FIG. 13 illustrates providing and maintaining computing capacity using computing modules on shelves in a rack.

FIG. 13 illustrates providing and maintaining computing capacity using computing modules on shelves in a rack. At 400, one or more computing modules are provided on a shelf. The computing modules may include one or more circuit board assemblies in a vertical orientation and one or more hard disk drives in a vertical orientation. In some embodiments, some of the hard disk drives in the computing module are in a vertical orientation and other hard disk drives in the computing module are in a horizontal orientation. At 402, the computing modules are operated to perform computing operations.

At 404, one of the vertically oriented hard drives in a computing module is removed and replaced by sliding the failed hard disk drive out the top of the computing module and sliding a replacement hard disk drive in through the top of the computing module. In certain embodiments, one or more of the horizontally oriented hard disk drives are removed and replaced by sliding the failed hard disk drive out through a side of the computing module and sliding a replacement hard disk drive in through the side of the computing module.

In some embodiments, the vertically oriented hard drives in a computing module can be removed and replaced without removing any panels or other components of a computing module. In some embodiments, the horizontally oriented hard drives in a computing module can be removed and replaced without removing any panels or other components of a computing module. For example, in certain embodiments, computing module 106 may be partially withdrawn from the rack to gain immediate access to the hard disk drives. The vertically oriented hard disk drives may be removable from the top without removal of any panels or other components. Similarly, the horizontally oriented hard disk drives may be removable from the top without removal of any panels or other components.

In various embodiments described above, each of the circuit board assemblies on a double sided assembly may operate as a separate computing unit. In certain embodiments, however, circuit board assemblies on the opposite sides of a double-sided assembly may cooperate to function as a single computing unit. For example, the CPUs for a computing unit may be located on the right circuit board assembly of a module and data input/output circuitry and DIMMs for the computing unit may be located on the left side circuit board assembly of the module. In addition, circuit board assemblies on one side of the module may be coupled to, and access, hard disk drive assemblies on the other side of the module. In certain embodiments, circuit board assemblies on both sides of a module share access to some or all of the hard disk drives in a computing module.

Although in the embodiments described above, the hard disk drives were mounted on directly to the chassis members and lower drive carrier, in various embodiments, hard disk drives or other data storage devices may be mounted to a chassis using other mounting elements. For example, hard disk drives may be mounted on square tubes that support the drives and raise the drives above the bottom of a chassis.

In some embodiments, a rack system includes rack-mounted fans external to computer systems in the rack. The rack-mounted fans may provide air flow through the computer systems.

Although in the embodiments described above, some of the computer modules have been described as being about 5 U in height, modules may in various embodiments be 3 U, 4 U, 6 U or any other height or dimensions.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A system, comprising:
   a rack;
   a shelf module mounted within the rack;
   a horizontal array of computing modules within the shelf module, wherein at least one of the computing modules comprises:
      a chassis;
      a pair of circuit board assemblies coupled to the chassis in a first orientation, wherein the pair of circuit board assemblies comprises one or more processors and one or more memory slots; and
      a plurality of mass storage devices in a second orientation, wherein the first orientation and the second orientation are different orientations;
      wherein at least one of the mass storage devices is removable from the least one computing module without removing others of the plurality of mass storage devices.

2. The system of claim 1, wherein the chassis comprises one or more guides for at least one of the mass storage devices, wherein the at least one mass storage device is configured to slide on at least one of the guides to remove the mass storage device from the chassis.

3. The system of claim 1, wherein the pair of circuit board assemblies comprises a left circuit board assembly coupled to the chassis and a right circuit board assembly coupled to the chassis.

4. The system of claim 1, wherein the shelf module comprises a vertical member between at least two adjacent computing modules of the array of computing modules.

5. The system of claim 1, further comprising another shelf module coupled to the rack, wherein the shelf module and the other shelf module are configured to nest with one another.

6. The system of claim 1, further comprising another shelf module coupled to the rack and comprising another horizontal array of computing modules, wherein the shelf module and the other shelf module are configured to interlock with one another.

7. The system of claim 1, further comprising one or more air moving devices configured to move air from front to back through the at least one of the computing modules.

8. A computing module, comprising:
   a chassis configured to be installed alongside another computing module in a horizontal array within a rack-mountable shelf module;
   a pair of circuit board assemblies coupled to the chassis in a first orientation, wherein the pair of circuit board assemblies comprises one or more processors and one or more memory slots; and
   a plurality of mass storage devices in a second orientation, wherein the first orientation and the second orientation are different orientations;
   wherein at least one of the mass storage devices is removable from the computing module without removing others of the plurality of mass storage devices.

9. The computing module of claim 8, wherein the first orientation is a primarily vertical orientation.

10. The computing module of claim 8, wherein the chassis comprises one or more guides for at least one of the mass storage devices, wherein the at least one mass storage device is configured to slide on at least one of the guides to remove the mass storage device from the chassis.

11. The computing module of claim 8, further comprising two or more mass storage devices in the first orientation coupled to at least one of the circuit board assemblies.

12. The computing module of claim 8, wherein the pair of circuit board assemblies comprise a left circuit board assembly coupled to the chassis and a right circuit board assembly coupled to the chassis.

13. The computing module of claim 12, wherein the chassis comprises a left chassis member and a right chassis member coupled to one another, wherein the left circuit board assembly is coupled to the left chassis member and the right circuit board assembly is coupled to the right chassis member.

14. The computing module of claim 13, further comprising:
   a first set of one or more mass storage devices coupled to the left chassis member and operably coupled to the left circuit board assembly; and
   a second set of one or more mass storage devices coupled to the right chassis member and operably coupled to the right circuit board assembly.

15. The computing module of claim 12, further comprising a power supply unit coupled to the chassis, wherein the power supply unit is configured to supply electrical power to the left circuit board assembly and the right circuit board assembly.

16. The computing module of claim 8, wherein the computing module comprises a left computing unit configured to perform computing operations and a right computing unit configured to perform computing operations independent of the left computing unit.

17. The computing module of claim 16, further comprising a power supply under at least a portion of the left computing unit and at least a portion of the right computing unit.

18. The computing module of claim 8, wherein the plurality of mass storage devices are configured in two or more rows of two or more mass storage devices with an air passage between at least two adjacent rows.

19. An apparatus, comprising:
   a rack-mountable shelf module;
   a horizontal array of computing modules within the rack-mountable shelf module, wherein at least one of the computing modules comprises:
      a chassis;
      a pair of circuit board assemblies coupled to the chassis in a first orientation, wherein the pair of circuit board assemblies comprises one or more processors and one or more memory slots; and
      a plurality of mass storage devices in a second orientation, wherein the first orientation and the second orientation are different orientations;
      wherein at least one of the mass storage devices is removable from the least one computing module without removing others of the plurality of mass storage devices.

20. The apparatus of claim 19, wherein the pair of circuit board assemblies comprises a left circuit board assembly configured to perform computing operations and a right circuit board assembly configured to perform computing operations independent of the left circuit board assembly.

* * * * *